(12) United States Patent
Lee

(10) Patent No.: US 6,780,652 B2
(45) Date of Patent: Aug. 24, 2004

(54) SELF-ALIGNED MRAM CONTACT AND METHOD OF FABRICATION

(75) Inventor: Roger Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1 day.

(21) Appl. No.: 09/805,914

(22) Filed: Mar. 15, 2001

(65) Prior Publication Data

US 2002/0132464 A1 Sep. 19, 2002

(51) Int. Cl.[7] .............................................. H01L 21/00
(52) U.S. Cl. ............................................ 438/3; 438/238
(58) Field of Search ........................... 438/3, 238, 381; 257/295, 421, 422, 424, 425, 426; 365/158, 171, 173

(56) References Cited

U.S. PATENT DOCUMENTS

| | | | | |
|---|---|---|---|---|
| 5,659,499 A | * | 8/1997 | Chen et al. | 365/158 |
| 5,841,692 A | | 11/1998 | Gallagher et al. | |
| 5,940,319 A | * | 8/1999 | Durlam et al. | 365/158 |
| 6,153,443 A | * | 11/2000 | Durlam et al. | 257/295 |
| 6,269,018 B1 | * | 7/2001 | Monsma et al. | 365/145 |
| 6,358,756 B1 | * | 3/2002 | Sandhu et al. | 438/238 |
| 6,368,878 B1 | * | 4/2002 | Abraham et al. | 438/3 |
| 6,413,788 B1 | * | 7/2002 | Tuttle | 257/326 |
| 6,555,858 B1 | * | 4/2003 | Jones et al. | 257/295 |
| 2001/0040778 A1 | * | 11/2001 | Abraham et al. | |
| 2002/0132473 A1 | | 9/2002 | Chiang et al. | |

FOREIGN PATENT DOCUMENTS

EP          1 054 449 A2     11/2000

OTHER PUBLICATIONS

"Chemical–mechanical polishinig as an enabling technology for giant magnetoresistance devices", Y.Z. Hu et al., 1997 Elsevier Science SA, vol. 308–309, p. 555–561.

* cited by examiner

Primary Examiner—George Fourson
Assistant Examiner—Fernando L. Toledo
(74) Attorney, Agent, or Firm—Dickstein Shapiro Morin & Oshinsky LLP

(57) ABSTRACT

A method of forming self-aligned MRAM contacts is disclosed. MRAM stacks including an upper layer of a conductive material are formed over portions of integrated circuitry. An insulating material is formed over the substrate, including the MRAM stacks with the upper layer of conductive material. The insulating material is subsequently chemically mechanically polished or etched, stopping on the upper layer of conductive material, to expose portions of the conductive material which are used as self-aligned MRAM contacts.

42 Claims, 12 Drawing Sheets

SELF-ALIGNED MRAM CONTACT AND METHOD OF FABRICATION

FIELD OF THE INVENTION

The present invention relates MRAM semiconductor structures and, more particularly, to a method of forming self-aligned contacts in MRAM structures.

BACKGROUND OF THE INVENTION

Magnetic random access memories (MRAMs) employ magnetic multilayer films as storage elements. When in use, an MRAM cell stores information as digital bits, which in turn depend on the alternative states of magnetization of thin magnetic multilayer films forming each memory cell. As such, the MRAM cell has two stable magnetic configurations, high resistance representing a logic state 0 and low resistance representing a logic state 1, or vice versa.

A typical multilayer-film MRAM includes a number of bit or digit lines intersected by a number of word lines. At each intersection, a film of a magnetically coercive material is interposed between the corresponding bit line and word line. Thus, this magnetic material and the multilayer films from the digit lines form a magnetic memory cell which stores a bit of information.

The basic memory element of an MRAM is a patterned structure of a multilayer material, which is typically composed of a stack of different materials, such as copper (Cu), tantalum (Ta), permalloy (NiFe) or aluminum oxide ($Al_2O_3$), among others. The stack may contain as many as ten different overlapping material layers and the layer sequence may repeat up to ten times. Fabrication of such stacks requires deposition of the thin magnetic materials layer by layer, according to a predefined order.

FIG. 1 shows an exemplary conventional MRAM structure including MRAM stacks 22 which have three respective associated bit or digit lines 18. The digit lines 18, typically formed of copper (Cu), are first formed in an insulating layer 16 formed over underlayers 14 of an integrated circuit (IC) substrate 10. Underlayers 14 may include, for example, portions of integrated circuitry, such as CMOS circuitry. A pinned layer 20, typically formed of ferromagnetic materials, is provided over each digit line 18. A pinned layer is called "pinned" because its magnetization direction does not rotate in the presence of applied magnetic fields.

Many attempts are currently being made to integrate structures of magnetic random access memories, such as the MRAM stack 22 of FIG. 1, with semiconductor devices, for example CMOS circuits and/or with circuitry that can be formed over such integrated MRAM/CMOS devices. For this, conventional small contact openings from the pinned layers 20 of FIG. 1, for example, to word line conductors (not shown) are typically formed by photolithography techniques.

As known in the art, the photolithography techniques employ a mask that must be previously aligned to define small openings in such MRAM structures. With increased packing density of MRAM cells, however, there is a need for minimizing if not eliminating mask misalignment problems posed by the conventional photolithography techniques when forming small contact openings from MRAM stacks to adjacent circuitry. Accordingly, there is a need for an improved method for fabricating high quality MRAM structures, such as pinned layers and digit lines, which are highly integrated with a CMOS circuit, and which have self-aligned contacts that minimize the misalignment drawbacks of the prior art.

SUMMARY OF THE INVENTION

The present invention provides a method for forming self-aligned MRAM contacts for MRAM structures, such as magnetic layers of an MRAM stack, formed over various underlayers of an integrated circuit substrate. In an exemplary embodiment of the invention, MRAM stacks are formed to include a top layer of a conductive material, such as tungsten nitrogen. An insulating material is formed over the whole substrate including the MRAM stacks. The insulating material is subsequently chemically mechanically polished (CMP) to expose the upper surface of such conductive material and to form a self-aligned MRAM contact on a respective MRAM stack. Subsequent word lines and conductive plugs are formed over the self-aligned MRAM contacts.

These and other features and advantages of the invention will be more apparent from the following detailed description which is provided in connection with the accompanying drawings, which illustrate exemplary embodiments of the invention.

DETAILED DESCRIPTION OF THE PREFERRED EMBODIMENTS

In the following detailed description, reference is made to various exemplary embodiments of the invention. These embodiments are described with sufficient detail to enable those skilled in the art to practice the invention, and it is to be understood that other embodiments may be employed, and that structural and electrical changes may be made without departing from the spirit or scope of the present invention.

The term "substrate" used in the following description may include any semiconductor-based structure that has an exposed semiconductor surface. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to substrate in the following description, previous process steps may have been utilized to form regions or junctions in or on the base semiconductor or foundation.

The term "metal" is intended to include not only elemental metal, but metal with other trace metals or in various alloyed combinations with other metals as known in the semiconductor art. The term "metal" is also intended to include conductive oxides of such metals, as well as doped semiconductors and their respective conductive oxides.

Figure 1:
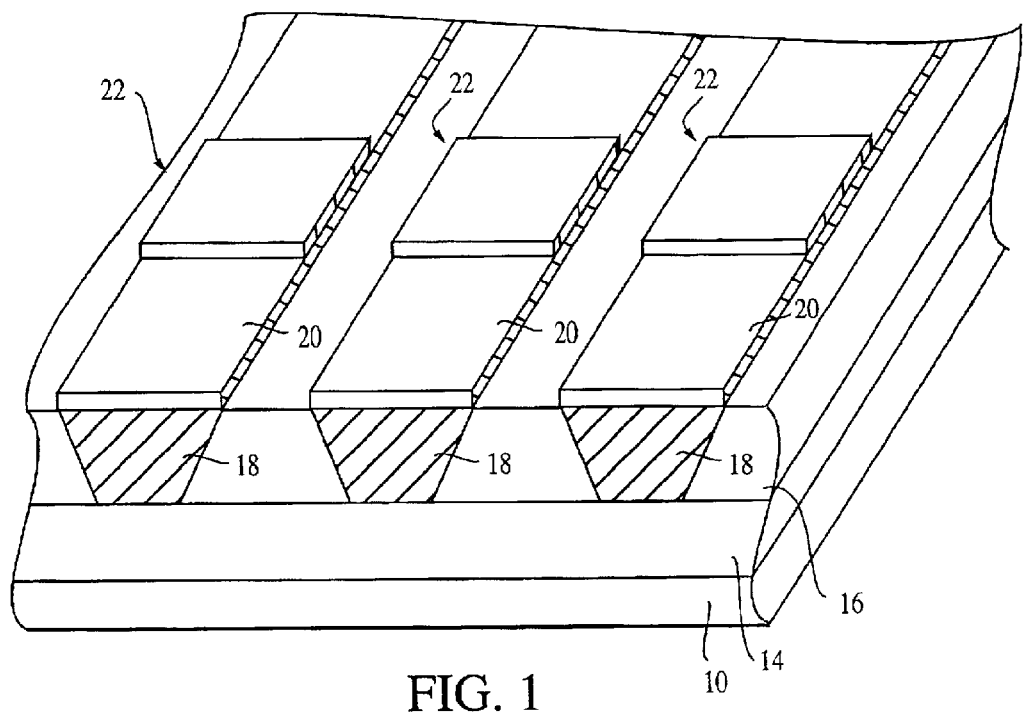
FIG. 1 is a schematic three-dimensional view of a portion of a conventional MRAM structure.
Figure 2:
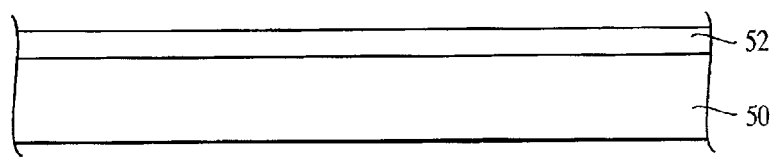
FIG. 2 illustrates a partial cross-sectional view of a semiconductor topography, at an intermediate stage of the processing, wherein a self-aligned MRAM contact will be constructed in accordance with the present invention.

Referring now to the drawings, where like elements are designated by like reference numerals, FIGS. 2–19 illustrate an exemplary embodiment of a method of forming self-aligned MRAM contacts (FIGS. 18–19) in MRAM structures. FIG. 2 depicts a portion of a semiconductor substrate 50 on which underlying layer 52 has been already formed according to well-known methods of the prior art. The underlying layer 52 could include, for example, circuit layers forming CMOS devices and circuits.

Figure 3:
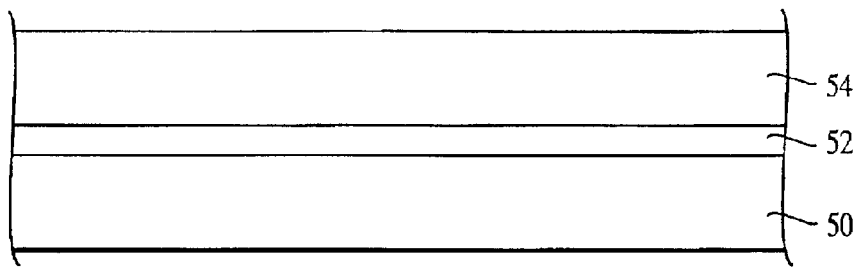
FIG. 3 illustrates a partial cross-sectional view of the self-aligned MRAM contact of the present invention at a stage of processing subsequent to that shown in FIG. 2.

Referring now to FIG. 3, an insulating layer 54 is formed over the substrate 50 and the underlying layer 52. In an exemplary embodiment of the invention, the insulating layer 54 is blanket deposited by spin coating to a thickness of about 1,000 Angstroms to about 10,000 Angstroms. However, other known deposition methods, such as sputtering by chemical vapor deposition (CVD), plasma enhanced CVD (PECVD), or physical vapor deposition (PVD), may be used also in accordance with the characteristics of the IC device already formed. The insulating layer 54 may be formed of a conventional insulator, for example, a thermal oxide of silicon, such as SiO or $SiO_2$, or a nitride such as $Si_3N_4$. Alternatively, a high temperature polymer, such as a polyimide, or a low dielectric constant inorganic material may also be employed.

Figure 4:
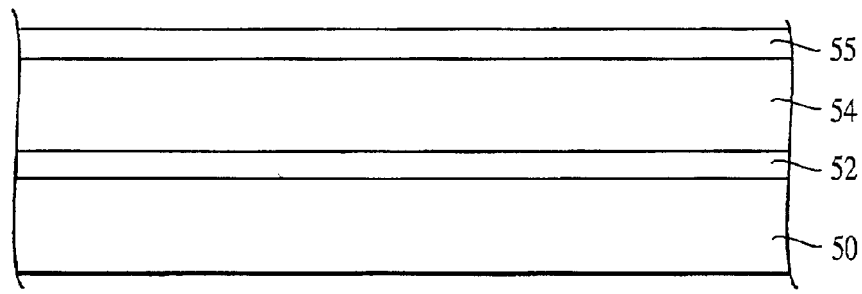
FIG. 4 illustrates a partial cross-sectional view of the self-aligned MRM contact of the present invention at a stage of processing subsequent to that shown in FIG. 3.

Next, as illustrated in FIG. 4, a photoresist layer 55 is formed over the insulating layer 54. The photoresist layer 55 is exposed through a mask 56 (FIG. 5) with high-intensity UV light. The mask 56 may include any suitable pattern of opaque and clear regions that may depend, for example, on the desired pattern to be formed in the insulating layer 54. This way, portions 55a of the photoresist layer 55 are exposed through portions 56a of the mask 56 wherever portions of the insulating layer 54 need to be removed.

Figure 5:
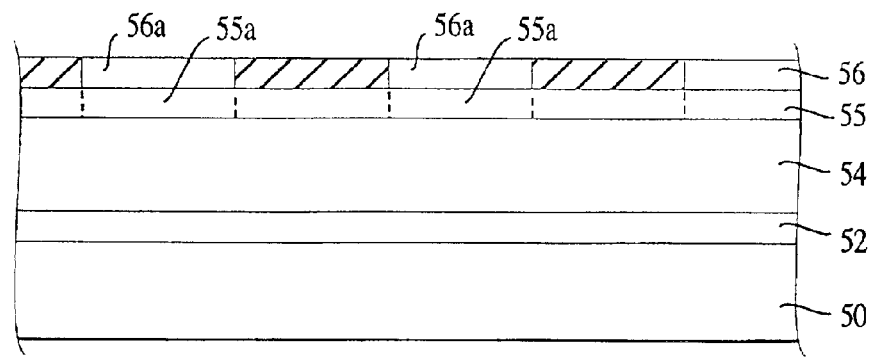
FIG. 5 illustrates a partial cross-sectional view of the self-aligned MRAM contact of the present invention at a stage of processing subsequent to that shown in FIG. 4.
Figure 6:
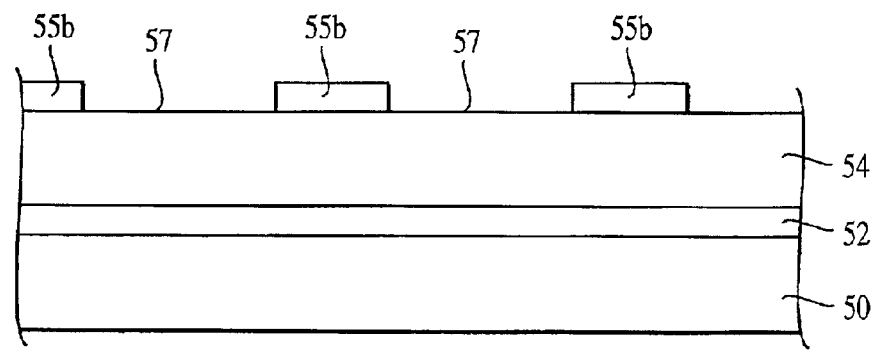
FIG. 6 illustrates a partial cross-sectional view of the self-aligned MRAM contact of the present invention at a stage of processing subsequent to that shown in FIG. 5.

Although FIG. 5 schematically illustrates mask 56 positioned over the photoresist layer 55, those skilled in the art will appreciate that mask 56 is typically spaced from the photoresist layer 55 and light passing through mask 56 is focussed onto the photoresist layer 55. After exposure and development of the exposed portions 55a, portions 55b of the unexposed and undeveloped photoresist are left over the insulating layer 54, as shown in FIG. 6. This way, openings 57 (FIG. 6) are formed in the photoresist layer 55.

Figure 7:
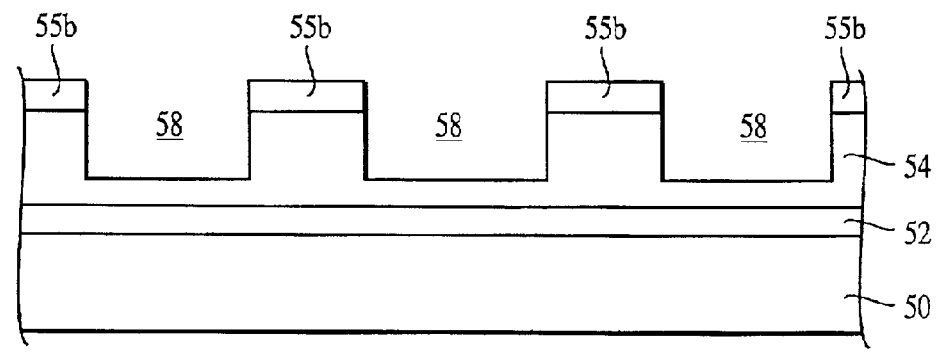
FIG. 7 illustrates a partial cross-sectional view of the self-aligned MRAM contact of the present invention at a stage of processing subsequent to that shown in FIG. 6.
Figure 8:
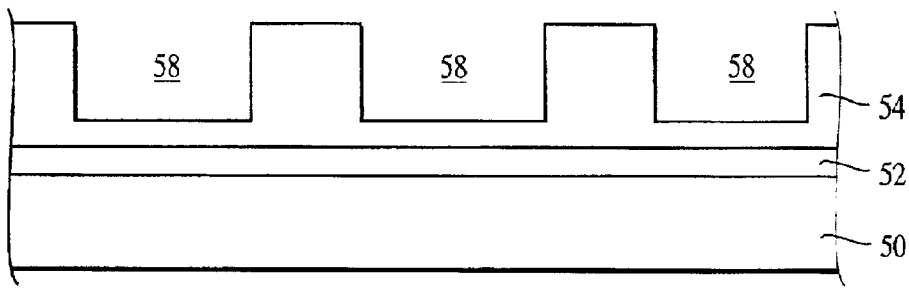
FIG. 8 illustrates a partial cross-sectional view of the self-aligned MRAM contact of the present invention at a stage of processing subsequent to that shown in FIG. 7.

An etch step is next performed to obtain grooves 58 in the insulating layer 54, as illustrated in FIGS. 7–8. The grooves 58 are etched to a depth of about 500 Angstroms to about 2,000 Angstroms, more preferably of about 1,000 Angstroms. Subsequent to the formation of the grooves 58, the remaining portions 55b of the positive photoresist layer 55 are then removed by chemicals, such as hot acetone or methylethylketone, or by flooding the substrate 50 with UV irradiation to degrade the remaining portions 55b to obtain the structure of FIG. 8.

Figure 9:
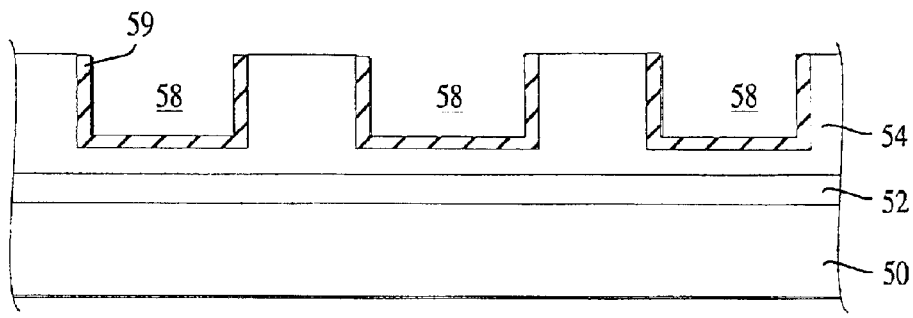
FIG. 9 illustrates a partial cross-sectional view of the self-aligned MRAM contact of the present invention at a stage of processing subsequent to that shown in FIG. 8.

Subsequent to the formation of the grooves 58 (FIGS. 7–8), a thin barrier layer 59 is formed in the grooves 58 and over the insulating layer 54, and then chemical mechanical polished to remove barrier layer material from the top portions of the insulating layer 54, as shown in FIG. 9. The barrier layer 59 may comprise bonding materials such as tantalum (Ta), titanium (Ti), titanium-tungsten (TiW), titanium nitride (TiN) or chromium (Cr), among others. The barrier layer 59 forms a strong mechanical and chemical bond between the conductive material which will be formed later and the insulating layer 54 to help prevent peeling of the formed conductive layer from the insulating layer. In a preferred embodiment of the invention, the barrier layer 59 is formed of sputtered tantalum. In this embodiment, tantalum is deposited to a thickness of about 5 nm to about 10 nm.

Figure 10:
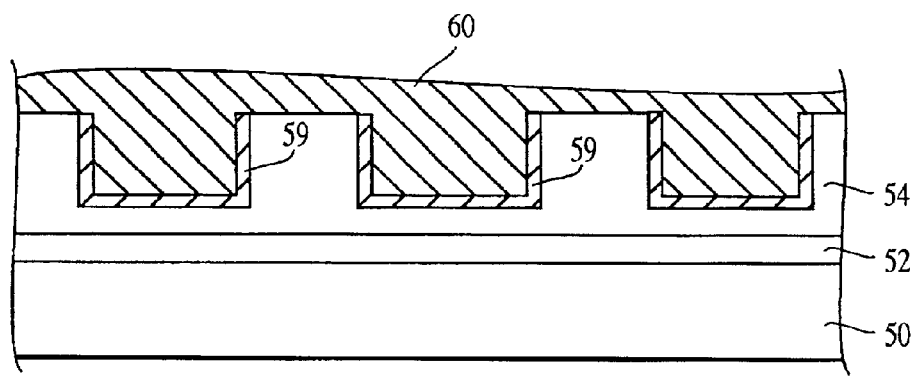
FIG. 10 illustrates a partial cross-sectional view of the self-aligned MRAM contact of the present invention at a stage of processing subsequent to that shown in FIG. 9.

Next, as illustrated in FIG. 10, a conductive material layer 60 is formed over the barrier layer 59 and the insulating layer 54 to fill in the grooves 58. In a preferred embodiment, the conductive material comprises copper (Cu). However, other conductive materials such as aluminum, tungsten or gold, among others, may be used also. Further, metal alloys may be employed also, depending on desired characteristics of the IC device.

Figure 11:
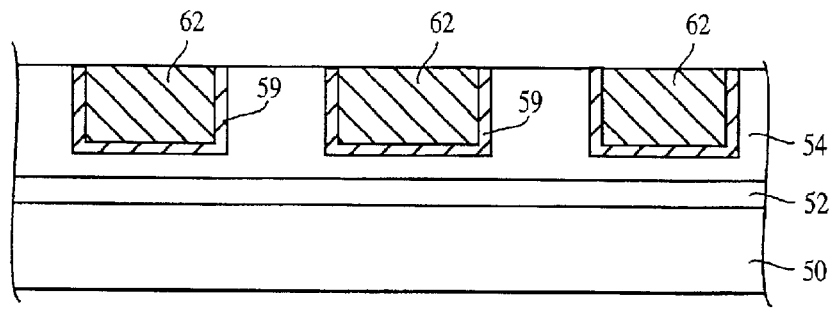
FIG. 11 illustrates a partial cross-sectional view of the self-aligned MRAM contact of the present invention at a stage of processing subsequent to that shown in FIG. 10.

The conductive material layer 60 is formed over the barrier layer 59 by deposition, for example, and then excess material is removed to form metal lines 62 (FIG. 11). In an exemplary embodiment of the present invention, the excess conductive material layer 60 is removed by means of chemical mechanical polishing (CMP) or a well-known RIE dry etching process. Either way, the top surfaces of the barrier layer 59 and the metal lines 62 are substantially flat and uniform across the entire surface of the substrate, as shown in FIG. 11. Each metal line 62 will form the bit or digit line of a conventional MRAM structure.

Figure 16:
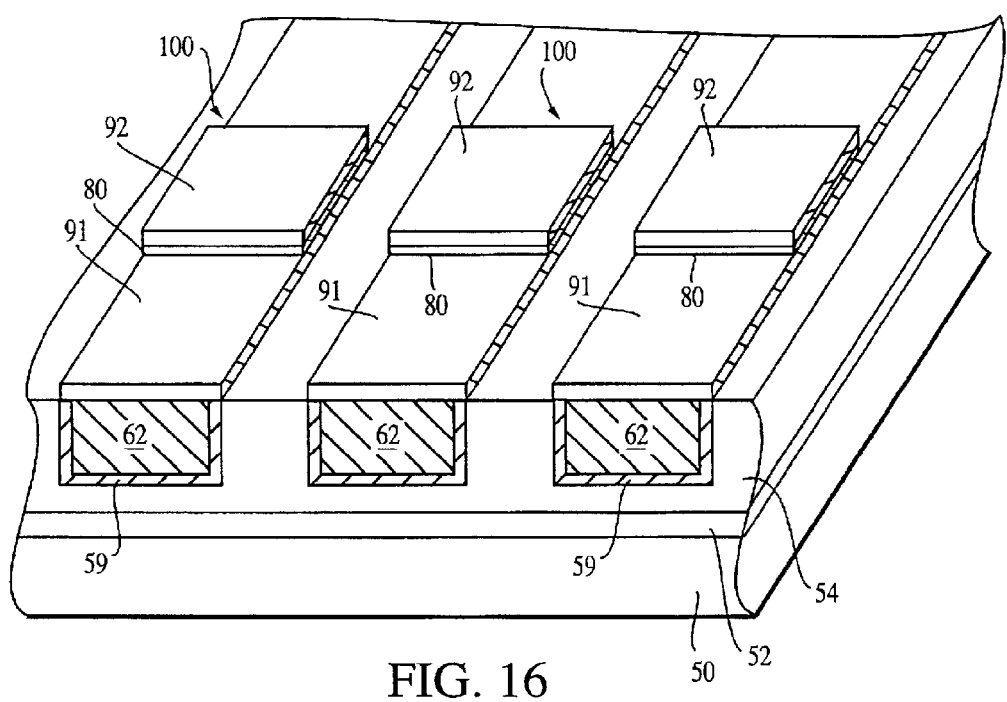
FIG. 16 is a partial three-dimensional view of the self-aligned MRAM contact of FIG. 15 at a stage of processing subsequent to that shown in FIG. 15.

After the CMP polishing process, the processing steps for the completion of the MRAM structures 100 having self-aligned MRAM contacts 99 (FIGS. 18–19) are now carried out. As such, a plurality of magnetic multilayer films constituting a first magnetic member 79 are first formed over the metal lines 62, which will be later patterned into pinned layers 91 (FIG. 16). The first magnetic member 79 is formed of various material layers, described below in more detail, which are successively deposited over the metal lines 62 and the insulating layer 54, as illustrated in FIG. 12.

Figure 12:
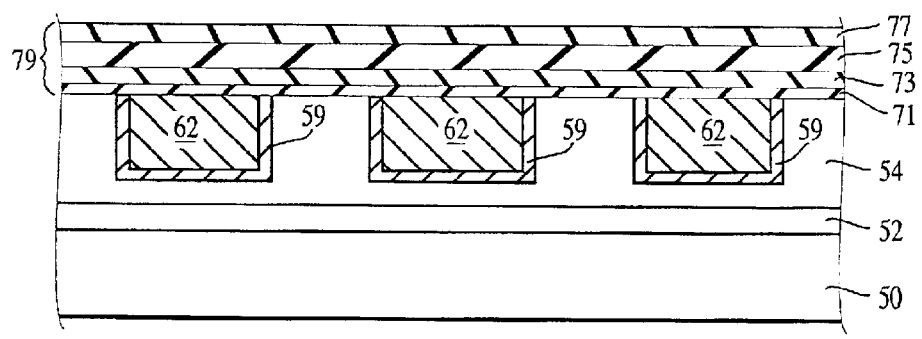
FIG. 12 illustrates a partial cross-sectional view of the self-aligned MRAM contact of the present invention at a stage of processing subsequent to that shown in FIG. 11.

In an exemplary embodiment of the present invention and as illustrated in FIG. 12, a first tantalum (Ta) layer 71 (of about 20–400 Angstroms thick, more preferably of about 50 Angstroms thick), a first nickel-iron (NiFe) layer 73 (of about 10–100 Angstroms thick, more preferably of about 60 Angstroms thick), a manganese-iron (MnFe) layer 75 (of about 10–100 Angstroms thick, more preferably of about 100 Angstroms thick) and a second nickel-iron (NiFe) layer 77 (of about 10–100 Angstroms thick, more preferably of about 60 Angstroms thick) are successively blanket deposited over the insulating layer 54 and the metal lines 62, to form the first magnetic member 79. Deposition of the layers 71, 73, 75 and 77 may be accomplished by magnetron sputtering, for example. However, other conventional deposition methods may be used also, as desired.

Figure 13:
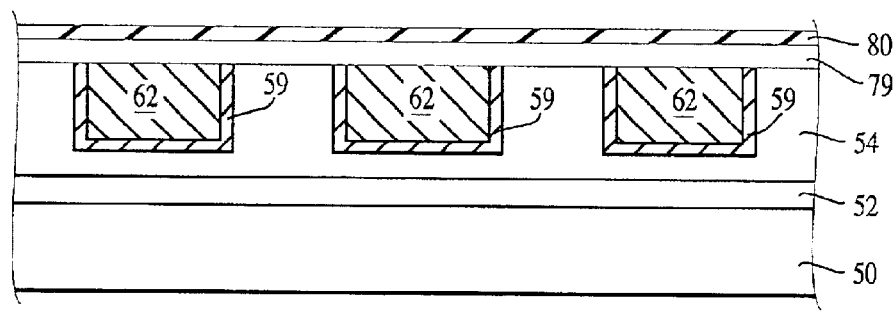
FIG. 13 illustrates a partial cross-sectional view of the self-aligned MRAM contact of the present invention at a stage of processing subsequent to that shown in FIG. 12.

Following the deposition of the layers 71, 73, 75 and 77, a nonmagnetic, electrically nonconductive layer 80 formed of, for example, aluminum oxide ($Al_2O_3$) (of about 5–25 Angstroms thick, more preferably of about 15 Angstroms thick) is next formed overlying the first magnetic member 79, as shown in FIG. 13. Although aluminum oxide is the preferred material, it must be understood that the invention is not limited to its use, and other nonmagnetic materials, such as copper (Cu), titanium oxide ($TiO_2$), magnesium oxide (MgO), silicon oxide ($SiO_2$) or aluminum nitride (AlN), may be used also.

Figure 14:
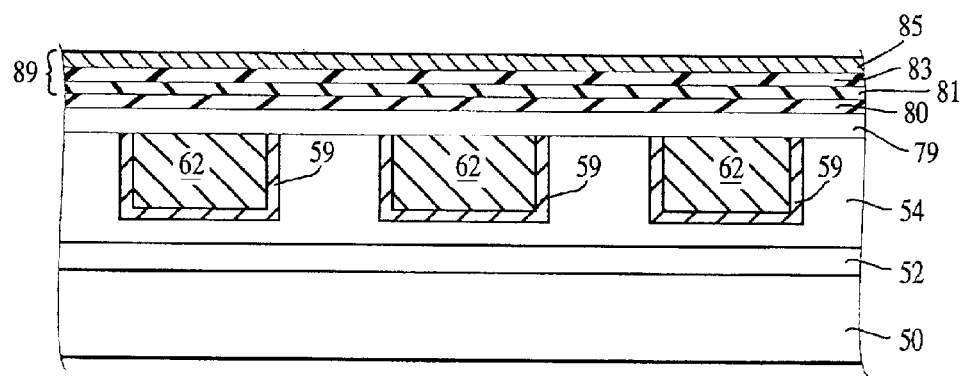
FIG. 14 illustrates a partial cross-sectional view of the self-aligned MRAM contact of the present invention at a stage of processing subsequent to that shown in FIG. 13.
Figure 15:
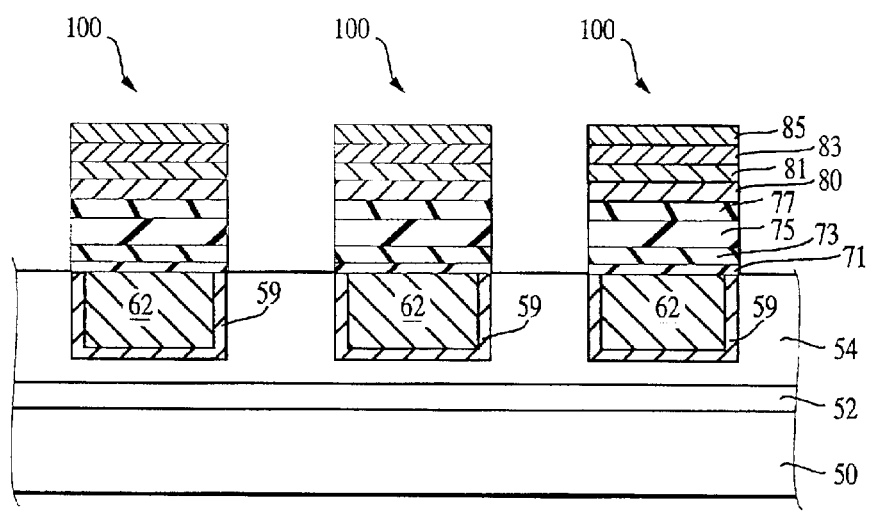
FIG. 15 illustrates a partial cross-sectional view of the self-aligned MRAM contact of the present invention at a stage of processing subsequent to that shown in FIG. 14.
Figure 19:
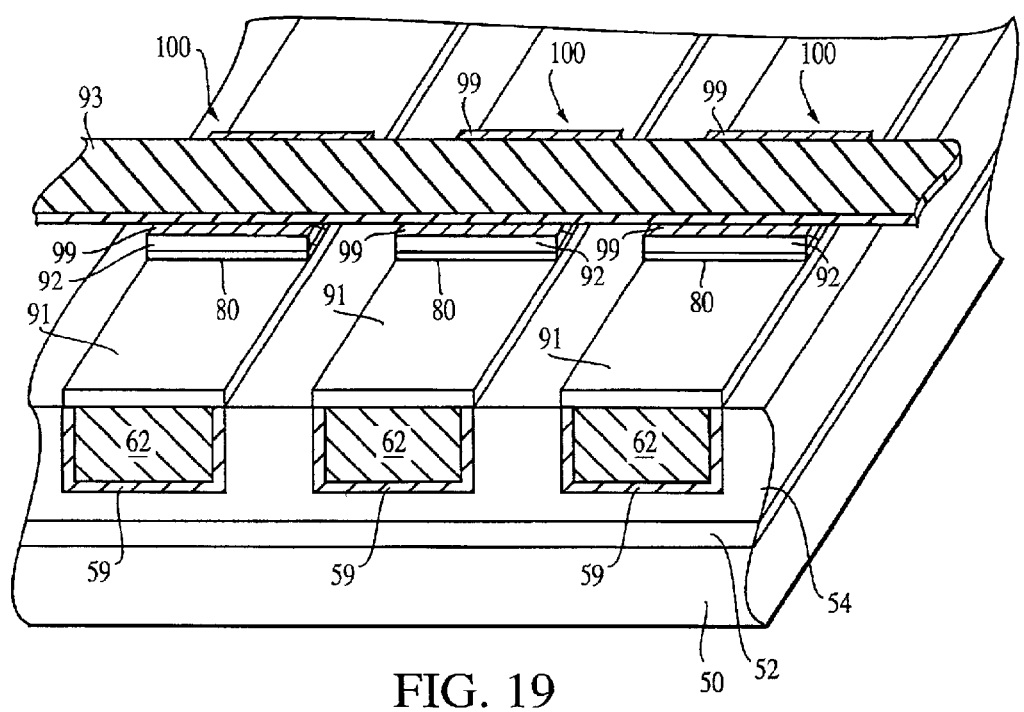
FIG. 19 is a partial three-dimensional view of the self-aligned MRAM contact of FIG. 15 at a stage of processing subsequent to that shown in FIG. 18.

Referring now to FIG. 14, a plurality of magnetic multilayer films forming a second magnetic member 89 are next formed over the nonmagnetic layer 80. Accordingly, in an exemplary embodiment of the present invention, a third nickel-iron (NiFe) layer 81 (of about 10–100 Angstroms thick, more preferably of about 40 Angstroms thick), a second tantalum (Ta) layer 83 (of about 10–100 Angstroms thick, more preferably of about 50 Angstroms thick) and a conductive layer 85 (of about 100–400 Angstroms thick, more preferably of about 200–300 Angstroms thick) are successively blanket deposited over the nonmagnetic layer 80, to form the second magnetic member 89, as shown in FIG. 14. Deposition of the layers 81, 83 and 85 may be accomplished by magnetron sputtering, for example, but other conventional deposition methods may be used also, depending on the characteristics of the IC devices constructed previously to the formation of the MRAM structures 100 (FIG. 19).

In an exemplary embodiment of the present invention, the conductive layer 85 may be formed of tungsten nitrogen (WN), which is deposited to a thickness of about 100–400 Angstroms, more preferably of about 200–300 Angstroms. However, the invention is not limited to this exemplary embodiment, and other conductive materials, for example metals such as tungsten (W), copper (Cu), gold (Au) or platinum (Pt), among others, may be used also, as desired.

Next, layers 71, 73, 75, 77, 80, 81, 83 and 85 (FIGS. 12–14) are patterned into a plurality of MRAM structures or cells 100 (FIGS. 15–16) including columns of pinned layers 91 and rows of sense layers 92. Thus, each MRAM structure 100 includes the pinned layer 91 (as part of the first magnetic member 79) separated from a sense layer 92 (as part of the second magnetic member 89) by the nonmagnetic layer 80. For simplicity, the multilayer stack forming the pinned layer 91 is illustrated in FIG. 16 as a single layer. Similarly, the multilayer stack forming the sense layer 92 is also illustrated in FIG. 16 as a single layer. It must be understood, however, that the pinned layer 91 includes portions of the copper line 62 and of the layers 71, 73, 75 and 77, while the sense layer 92 includes portions of the layers 81, 83 and 85.

Patterning of the plurality of layers forming the pinned and sense layers of the MRAM structures 100 (FIG. 16), that is patterning of layers 71, 73, 75, 77, 80, 81, 83 and 85 may be accomplished by ion milling which typically involves physical sputtering of each layer by an argon ion beam. Patterning may be also accomplished by using a reactive plasma etch, performed, for example, in electron cyclotron resonance (ECR) or other high density plasmas, such as an inductively coupled plasma system, or a helicon plasma system containing chlorine as the source gas. A mixture of chlorine with other gases, such as argon, neon or helium, among others, may be used also. In any event, the pinned and sense layers 91, 92 are patterned and etched so that the pinned layers 91 correspond to the metal lines 62 that form the bottom electrodes of the pinned layers 91.

Figure 17:
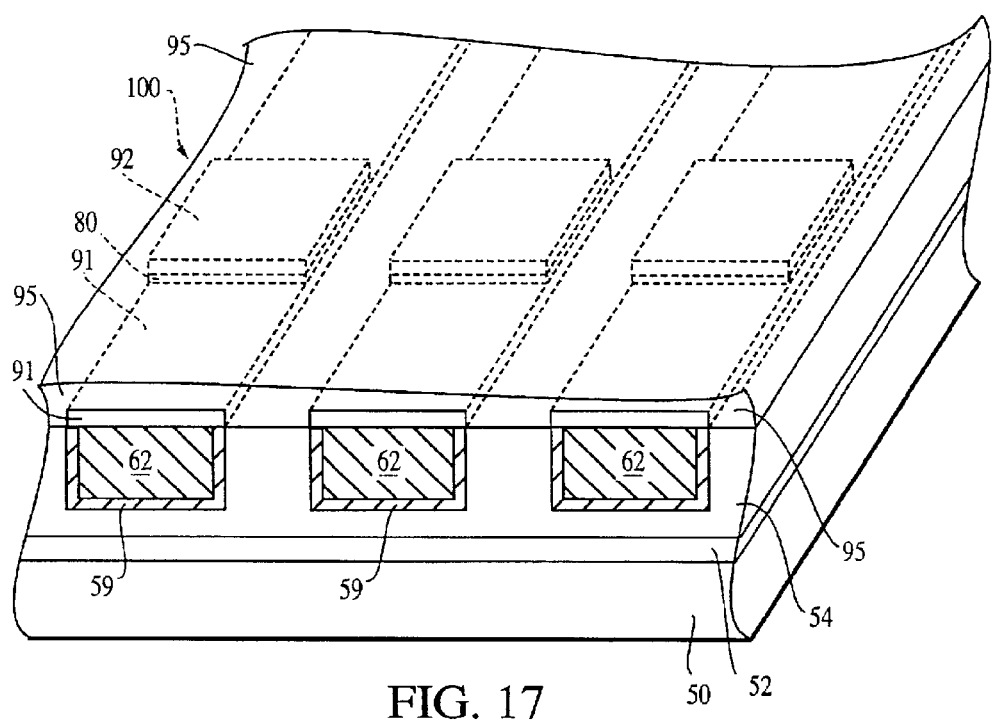
FIG. 17 is a partial three-dimensional view of the self-aligned MRAM contact of FIG. 15 at a stage of processing subsequent to that shown in FIG. 16.

Next, an insulating layer 95 (FIG. 17) is formed overlying the substrate 50 including the MRAM structures 100 to a thickness of about 90–10,000 Angstroms, more preferably of about 5,000 Angstroms. The insulating layer 95 completely fills the spaces between any adjacent MRAM structures 100, as shown in FIG. 17. In an exemplary embodiment of the invention, the insulating layer 95 is formed of a nitride material such as silicon nitride ($Si_3N_4$), which may be formed by conventional deposition methods, such as sputtering by chemical vapor deposition (CVD), plasma enhanced CVD (PECVD), or physical vapor deposition (PVD), among others. However, other conventional insulating materials, for example, aluminum oxide, a thermal oxide of silicon, such as SiO or $SiO_2$, or a high temperature polymer, such as a polyimide, a low dielectric constant inorganic material, amorphous dielectric, or bias sputtered quartz may also be employed.

Figure 18:
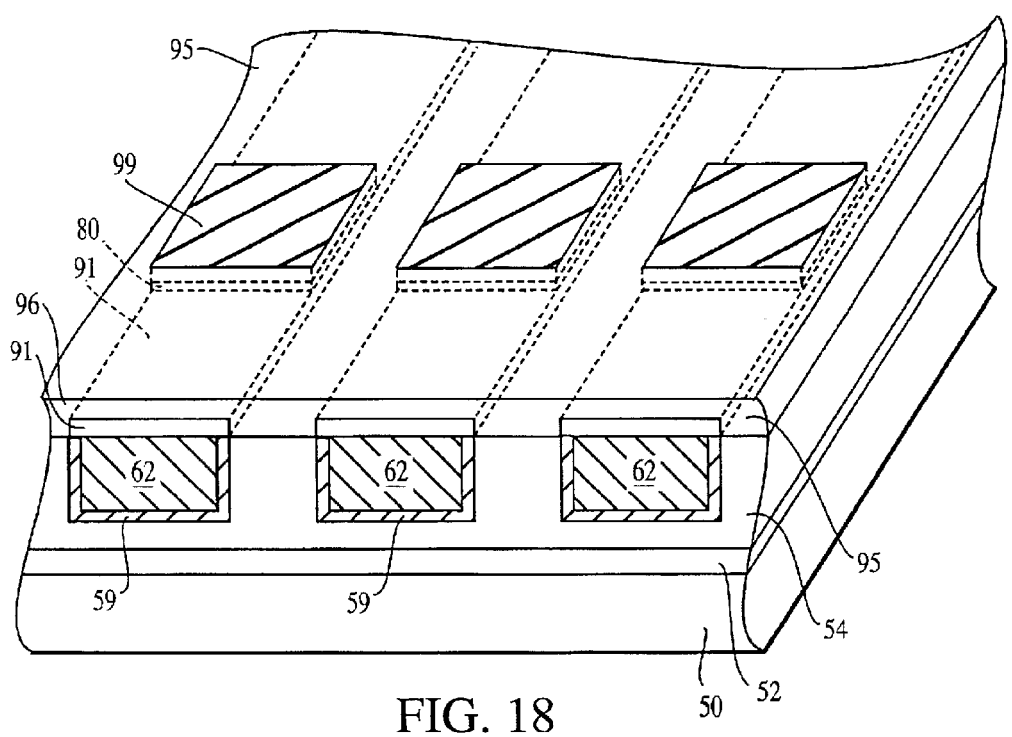
FIG. 18 is a partial three-dimensional view of the self-aligned MRAM contact of FIG. 15 at a stage of processing subsequent to that shown in FIG. 17.

Subsequent to the formation of the insulating layer 95 (FIG. 17), portions of the insulating layer 95 that are formed over the top surface of the MRAM structures 100 are removed by means of chemical mechanical polishing (CMP) or well-known RIE dry etching processes. In an exemplary embodiment of the invention, the insulating layer 95 is chemical mechanical polished so that an abravise polish removes the top surface of the insulating layer 95 above the MRAM structures 100, down to or near the planar surface of the top surface of the conductive layer 85, to form respective self-aligned MRAM contacts 99 in a polished insulating layer 96, as illustrated in FIG. 18. This way, the conductive layer 85, which was formed as part of the sense layer 92 of the MRAM structure 100, acts as a polishing stop layer in the formation of the self-aligned contacts 99.

Additional steps to create a functional MRAM cell having a self-aligned contact may be carried out. Thus, additional insulating layers and conductive plugs from the self-aligned MRAM contacts 99 to word line conductors, to enable bidirectional current flow in the presence of a read and write signal, may be formed to complete the fabrication process of such MRAM structures. For example, FIG. 19 illustrates schematically three MRAM cell structures 100 coupled to a word line 93 that intersects three pinned layers 91 and associated sense layers 92 at respective self-aligned MRAM contacts 99. As known in the art, the word line 93 may be formed of copper, for example, by patterning a mask on a dielectric layer, which is formed over the sense layers 92 including the self-aligned MRAM contacts 99, and by forming a trench in which conductive word line 93 is formed on a direction orthogonal to that of the sense layer 92. For a better understanding of the invention, the polished insulating layer 96 has been omitted in FIG. 19 to illustrate the pinned layers and sense layers 91, 92 below the word line 93. However, it must be understood that the space between the pinned layers and sense layers 91, 92 and below the word line 93 is filled with the insulating layer 96.

Although FIG. 19 illustrates self-aligned MRAM contacts 99 in direct contact and adjacent to the word line 93, it must be understood that the invention is not limited to this embodiment, and other interceding structures, such as conductive plugs and/or metal lines from the self-aligned MRAM contacts 99 to the word line 93 may be formed also, as desired.

Figure 20:
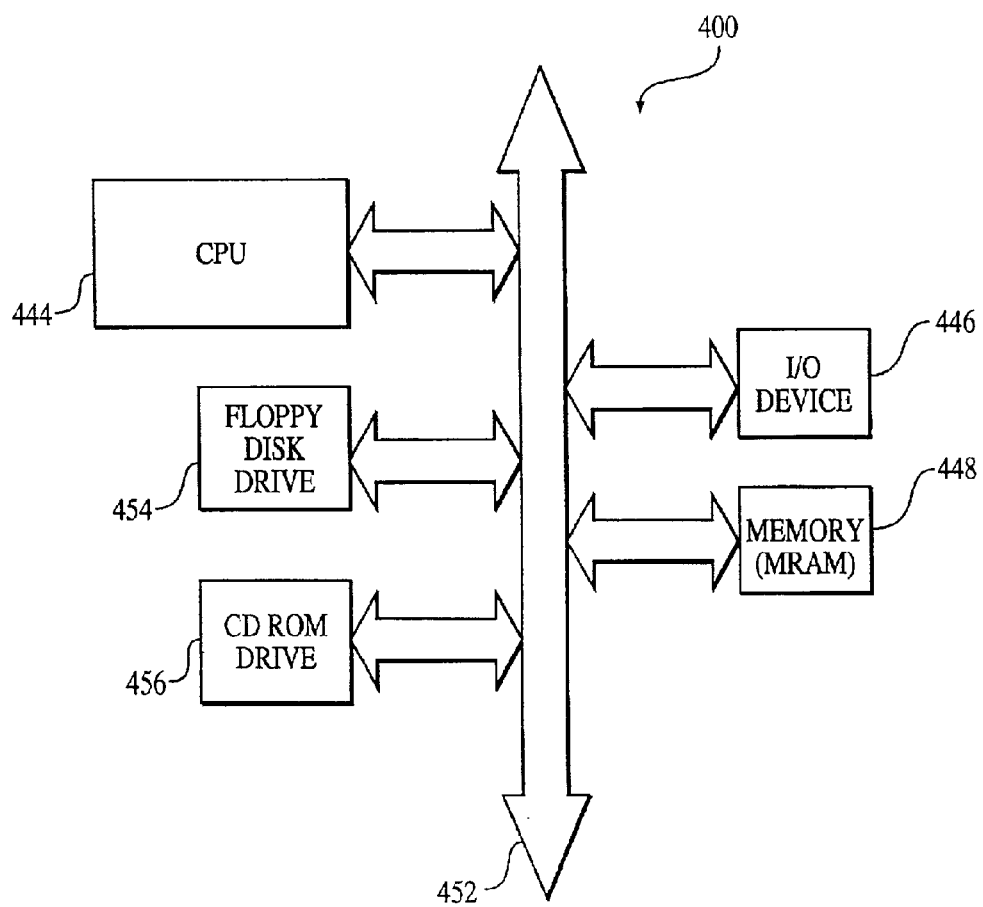
FIG. 20 is a schematic diagram of a processor system incorporating the self-aligned MRAM contact constructed in accordance with the present invention.

A typical processor based system 400 which includes a memory circuit 448, for example an MRAM with MRAM cell structures 100 having self-aligned MRAM contacts 99 (FIGS. 18–19) constructed according to the present invention is illustrated in FIG. 20. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452.

In the case of a computer system, the processor system may include peripheral devices such as a floppy disk drive 454 and a compact disk (CD) ROM drive 456 which also communicate with CPU 444 over the bus 452. Memory 448 may be combined with the processor, i.e. CPU 444, in a single integrated circuit.

Although the exemplary embodiments described above illustrate the formation of three MRAM cell structures 100 having respective self-aligned MRAM contacts 99 (FIGS. 18–19) it is to be understood that the present invention contemplates the use of a plurality of self-aligned MRAM contacts 99 of pinned layers and sense layers as part of a plurality of MRAM cells arranged, for example, in rows and columns in a memory cell array. In addition, although the exemplary embodiments described above refer to a specific topography of the MRAM structures with specific magnetic materials forming such structures, it must be understood that the invention is not limited to the above-mentioned magnetic materials, and other magnetic and ferromagnetic materials, such as nickel-iron (Permalloy) or iron, among others, may be used also. Further, although the exemplary embodiments described above refer to patterning of the MRAM structures by reactive plasma etching, it must be understood that the present invention contemplates the use of other methods of patterning and etching.

The present invention is thus not limited to the details of the illustrated embodiment. Accordingly, the above description and drawings are only to be considered illustrative of exemplary embodiments which achieve the features and advantages of the present invention. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A method of forming a magnetic random access memory, said method comprising:

forming a plurality of spaced apart first conductive layers over an insulating layer formed over a substrate;

forming a plurality of spaced apart magnetic memory element stacks over said plurality of first conductive layers, wherein each of said magnetic memory element stacks is formed by the steps of forming a first magnetic layer over a corresponding first conductive layer and forming a second magnetic layer over said first magnetic layer, said second magnetic layer having an associated top conductive layer;

forming an insulating material over and in between said spaced apart magnetic memory element stacks; and removing at least a portion of said insulating material over at least one of said memory element stacks to expose the top conductive layer of said at least one memory element stack.

2. The method of claim 1, wherein said act of removing at least a portion of said insulating material further comprises exposing an upper surface of said top conductive layer.

3. The method of claim 1, further comprising forming a nonmagnetic layer between said second magnetic layer and said first magnetic layer.

4. The method of claim 2, wherein said insulating material is removed to expose an upper surface of a plurality of top conductive layers associated with respective memory element stacks, said method further comprising forming a plurality of second conductors each in electrical connection with a plurality of said exposed upper surfaces, said plurality of second conductors running substantially orthogonal to said plurality of first conductive layers.

5. The method of claim 1, wherein said act of removing at least a portion of said insulating material further comprises chemical mechanical polishing of said insulating material to expose an upper surface of said top conductive layer.

6. The method of claim 1, wherein said top conductive layer is formed of a material selected from the group consisting of tungsten nitrogen, tungsten, gold, platinum and copper.

7. The method of claim 1, wherein said insulating material is formed of a material selected from the group consisting of silicon nitride and oxides.

8. The method of claim 1, wherein said insulating material is a high temperature polymer.

9. The method of claim 1, wherein said insulating material is a low dielectric constant inorganic material.

10. The method of claim 1, wherein said insulating material is silicon nitride.

11. The method of claim 1, wherein said act of forming said first magnetic layer further comprises the step of forming a first plurality of stacked layers, said first plurality of stacked layers including at least one magnetic material layer.

12. The method of claim 11, wherein said magnetic material layer contains a material selected from the group consisting of tantalum, nickel-iron, tungsten-nitrogen, nickel, cobalt-nickel-iron, iron, and manganese-iron.

13. The method of claim 12, wherein said first plurality of stacked layers comprises layers of tantalum, nickel-iron and manganese-iron.

14. The method of claim 12 further comprising etching said first plurality of stacked layers to have a width which coincides with the width of said first conductive layers.

15. The method of claim 1, wherein said act of forming said second magnetic layer further comprises forming a second plurality of stacked layers, said second plurality of stacked layers including at least one magnetic material layer and said conductive layer.

16. The method of claim 15, wherein said magnetic material layer includes a material selected from the group consisting of tantalum, nickel-iron, tungsten-nitrogen, nickel, cobalt-nickel-iron, iron, and manganese-iron.

17. The method of claim 16, wherein said second plurality of stacked layers comprises layers of tantalum, nickel-iron and tungsten nitrogen.

18. The method of claim 16, further comprising etching said second plurality of stacked layers.

19. The method of claim 1, wherein said first magnetic layer has a pinned magnetic orientation.

20. The method of claim 1, wherein said second magnetic layer has a free magnetic orientation.

21. A method of forming a magnetic random access memory, said method comprising:
 forming a plurality of spaced apart first conductive layers over an insulating layer formed over a substrate;
 forming a plurality of spaced apart magnetic memory element stacks over said plurality of first conductive layers, wherein each of said magnetic memory element stacks is formed by the steps of forming a first magnetic layer over a corresponding first conductive layer and forming a second magnetic layer over said first magnetic layer, said second magnetic layer having an associated a top conductive layer;
 forming an insulating material over and in between said spaced apart magnetic memory element stacks;
 removing at least a portion of said insulating material to expose upper surfaces of a plurality of said memory element stacks; and
 forming a plurality of spaced apart second conductive layers over respective sets of said exposed upper surfaces, said second conductive layers running substantially orthogonal to said first conductive layers, one of said first and second conductive layers being bit lines and the other of said first and second conductive layers being word lines.

22. The method of claim 21, further comprising forming a nonmagnetic layer between said first magnetic layer and said second magnetic layer.

23. The method of claim 22, wherein said nonmagnetic layer is formed of a material selected from the group consisting of aluminum oxide, titanium oxide, magnesium oxide, silicon oxide and aluminum nitride.

24. The method of claim 21, wherein said act of forming said insulating material further comprises depositing said insulating material.

25. The method of claim 21, wherein said act of removing portion of said insulating material further comprises chemical mechanical polishing of said insulating material relative to said upper surfaces of said top conductive layers.

26. The method of claim 21, wherein said top conductive layers are formed of a material selected from the group consisting of tungsten nitride, tungsten, gold, platinum and copper.

27. The method of claim 21, wherein at least one of said top conductive layers is formed of tungsten nitride.

28. The method of claim 21, wherein at least one of said top conductive layers is formed of tungsten.

29. The method of claim 21, wherein said insulating material is formed of a material selected from the group consisting of silicon nitride and oxides.

30. The method of claim 21, wherein said insulating material is a high temperature polymer.

31. The method of claim 21, wherein said insulating material is a low dielectric constant inorganic material.

32. The method of claim 21, wherein said insulating material is silicon nitride.

33. The method of claim 21, wherein said act of forming said first magnetic layer further comprises the step of forming a first plurality of stacked layers, said first plurality of stacked layers including at least one magnetic material layer.

34. The method of claim 33, wherein said magnetic material layer contains a material selected from the group consisting of tantalum, nickel-iron, tungsten-nitrogen, nickel, cobalt-nickel-iron, iron, and manganese-iron.

35. The method of claim 34, wherein said first plurality of stacked layers comprises layers of tantalum, nickel-iron and manganese-iron.

36. The method of claim 34 further comprising etching said first plurality of stacked layers to have a width which coincides with the width of said plurality of first conductive layers.

37. The method of claim 21, wherein said act of forming said second magnetic layer further comprises forming a second plurality of stacked layers, said second plurality of stacked layers including at least one magnetic material layer and said top conductive layer.

38. The method of claim 37, wherein said magnetic material layer includes a material selected from the group consisting of tantalum, nickel-iron, tungsten-nitrogen, nickel, cobalt-nickel-iron, iron, and manganese-iron.

39. The method of claim 38, wherein said second plurality of stacked layers comprises layers of tantalum, nickel-iron and tungsten nitrogen.

40. The method of claim 39 further comprising etching said second plurality of stacked layers.

41. The method of claim 21, wherein said first magnetic layer has a pinned magnetic orientation.

42. The method of claim 21, wherein said second magnetic layer has a free magnetic orientation.

* * * * *